(12) United States Patent
Kasai et al.

(10) Patent No.: US 6,390,351 B1
(45) Date of Patent: May 21, 2002

(54) APPARATUS AND METHOD OF TRANSFERRING CONDUCTIVE BALLS AND APPARATUS AND METHOD OF SUPPLYING CONDUCTIVE BALLS

(75) Inventors: Teruaki Kasai; Shinji Sasaguri; Kenichi Takakura; Tadahiko Sakai; Kazuo Arikado, all of Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/692,208

(22) Filed: Oct. 20, 2000

(30) Foreign Application Priority Data

Oct. 22, 1999 (JP) .............................. 11-300970

(51) Int. Cl.$^7$ .............................. B23K 1/00; B23K 37/00
(52) U.S. Cl. .......................................... 228/41; 228/246
(58) Field of Search ................................. 228/245, 246, 228/41

(56) References Cited

U.S. PATENT DOCUMENTS

| | | | | |
|---|---|---|---|---|
| 4,871,110 A | * | 10/1989 | Fukasawa et al. | |
| 5,279,045 A | * | 1/1994 | Odashima et al. | |
| 5,431,332 A | * | 7/1995 | Kirby et al. | |
| 5,762,258 A | * | 6/1998 | Le Coz et al. | |
| 5,839,641 A | * | 11/1998 | Teng | |
| 6,056,190 A | * | 5/2000 | Foulke et al. | |
| 6,099,681 A | * | 8/2000 | Arikado et al. | |
| 6,119,927 A | * | 9/2000 | Ramos et al. | |
| 6,182,356 B1 | * | 2/2001 | Bolde | |
| 6,213,386 B1 | * | 4/2001 | Inoue et al. | |
| 6,237,219 B1 | * | 5/2001 | Arikado et al. | |
| 6,253,985 B1 | * | 7/2001 | Kajii | |
| 6,270,002 B1 | * | 8/2001 | Hayashi et al. | |

FOREIGN PATENT DOCUMENTS

JP          02001118875 A    *    4/2001

* cited by examiner

*Primary Examiner*—Tom Dunn
*Assistant Examiner*—Kiley Stoner
(74) *Attorney, Agent, or Firm*—McDermott, Will & Emery

(57) ABSTRACT

A conductive ball transferring apparatus including: an arranging member having in its top face a plurality of recesses in a predetermined arrangement pattern each capable of receiving one conductive ball therein; a tilting mechanism for tilting the arranging member with respect to a horizontal plane; a speed controller for controlling the moving speeds of the conductive balls that move along the top face of the tilted arranging member in a direction the arranging member has been tilted; and a transferring head for picking up the conductive balls arranged by the arranging member and transferring them onto predetermined positions. With this structure, the moving speeds of the conductive balls are stabilized and the conductive balls are arranged into the recesses quickly without fail, and thereby the transferring head can pick up these conductive balls onto predetermined positions promptly.

25 Claims, 9 Drawing Sheets

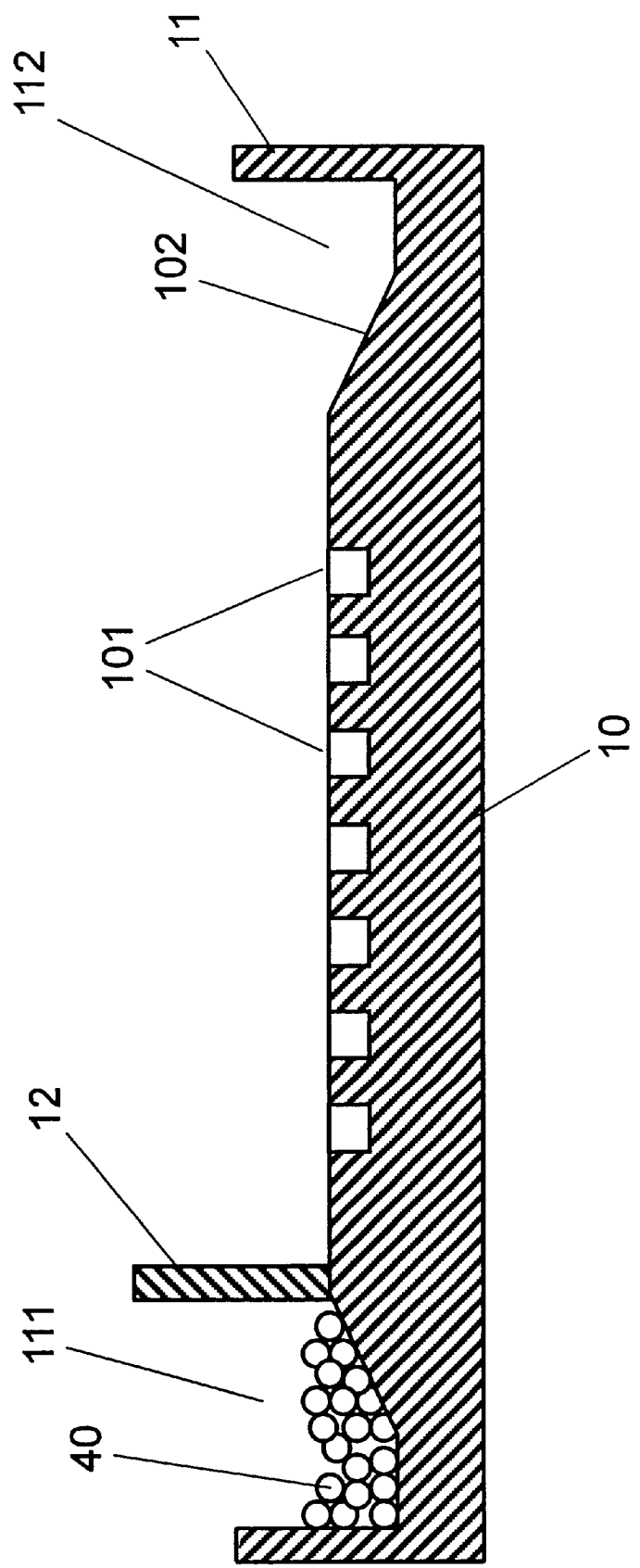

APPARATUS AND METHOD OF TRANSFERRING CONDUCTIVE BALLS AND APPARATUS AND METHOD OF SUPPLYING CONDUCTIVE BALLS

FIELD OF THE INVENTION

The present invention relates to a conductive ball transferring apparatus and method for attaching conductive balls and transferring them onto predetermined positions, and relates to a conductive ball supplying apparatus and method for supplying the conductive balls in an arrangement pattern to the transferring head of this transferring apparatus.

BACKGROUND OF THE INVENTION

As methods of forming metal bumps for electrodes on a substrate or electronic components, known are those of placing conductive balls, such as solder balls, onto the electrodes to form solder joints. For the placement of conductive balls, a method of vacuum-suck and transferring conductive balls with a transferring head is widely used. This method allows the placement of the conductive balls onto predetermined positions by the steps of moving a suction tool of the transferring head with the conductive balls vacuum-sucked into suction holes provided in the bottom face of the suction tool and thereafter stopping the vacuum suction. In order to attach the conductive balls onto the bottom face of the suction tool, conventional methods include the steps of lowering the suction tool toward a ball vessel that pools a large number of conductive balls therein, and vacuum-suck the balls from suction holes with the bottom face of the suction tool sunk in a layer of conductive balls.

However, the above method of sucking up the conductive balls from the ball vessel directly onto the suction tool has had the following problem. Since the conductive balls in the ball vessel have been thrown in a random fashion and are not arranged, it is difficult to suck up the conductive balls into all the respective suction holes in the bottom face of the suction tool quickly without fail. To address this problem, means for promoting the suction of the conductive balls, e.g. blowing gas into a layer of conductive balls to move them, and vibrating the suction tool in relation to the layer of conductive balls, have been needed. It has taken a considerable time to suck the conductive balls into all the respective suction holes without fail. Thus, conventional apparatuses of transferring conductive balls had problems in quickly sucking up the conductive balls onto the transferring head.

SUMMARY OF THE INVENTION

The present invention addresses the problem discussed above. It is, therefore, an object of the present invention to provide a conductive ball transferring apparatus that allows quick suction of the conductive balls onto a transferring head and to provide a conductive ball supplying apparatus suitable for the transferring apparatus.

The conductive ball transferring apparatus of the present invention is comprised of:

(a) an arranging member having in its top face a plurality of recesses in a predetermined arrangement pattern, each capable of receiving one conductive ball therein;

(b) a tilting mechanism for tilting the arranging member with respect to a horizontal plane;

(c) a speed controller for controlling moving speeds of the conductive balls that move along the top face of the tilted arranging member in a direction the arranging member has been tilted; and (d) a transferring head for picking up the conductive balls arranged on the arranging member and transferring them onto predetermined positions.

The conductive ball transferring method of the present invention includes the steps of:

(a) tilting with respect to a horizontal plane an arranging member having in its top face a plurality of recesses in a predetermined arrangement pattern, each capable of receiving one conductive ball therein;

(b) arranging the conductive balls into the recesses by moving the balls along the top face of the tilted arranging member at a predetermined speed in a direction the arranging member has been tilted; and (c) picking up the arranged conductive balls and transferring them onto predetermined positions.

The above transferring apparatus and method can stabilize the moving speeds of conductive balls, and allow the conductive balls to be quickly arranged into the recesses without fail and promptly picked up by the transferring head onto predetermined positions.

The conductive ball supplying apparatus of the present invention is comprised of, for example, the above components (a), (b), and (c) of the conductive ball transferring apparatus of the present invention, and is an apparatus for supplying the conductive balls in an arrangement pattern to the above transferring head.

The conductive ball supplying method of the present invention is comprised of, for example, the above steps (a) and (b) of the conductive ball transferring method of the present invention, and is a method for supplying the conductive balls in an arrangement pattern to the above transferring head.

The above supplying apparatus and method can stabilize the moving speeds of conductive balls, and allow the conductive balls to be arranged into the recesses of the arranging member quickly without fail.

BRIEF DESCRIPTION OF THE DRAWINGS

FIGS. 3 and 4 are cross sectional views of the above transferring apparatus;

DETAILED DESCRIPTION OF THE INVENTION

An exemplary embodiment of the present invention is hereinafter demonstrated with reference to the accompanying drawings.

Figure 1:
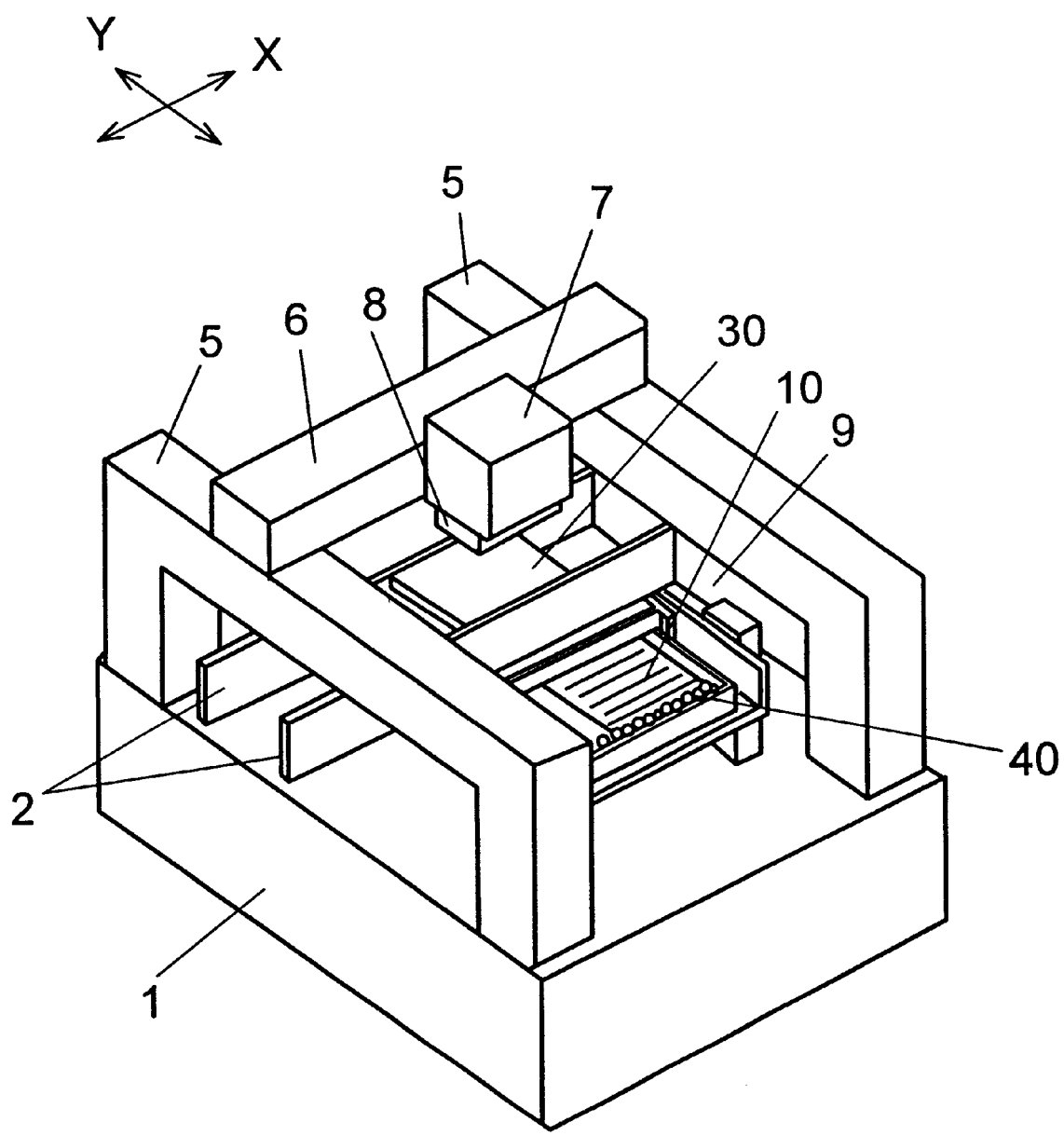
FIG. 1 is a perspective view of a conductive ball transferring apparatus in accordance with an exemplary embodiment of the present invention.

First, referring to FIG. 1, the structure of a conductive ball transferring apparatus is described.

In FIG. 1, provided in the center of base 1 in the X direction are carrier ways 2. Carrier ways 2 are used to carry and position substrate 30. The carrier ways 2 serve as a substrate supporting part for supporting substrate 30. On two edges facing each other of the top face of base 1, two Y-axis tables 5 are provided. Bridged over Y-axis tables 5 is X-axis table 6. Transferring head 7 having suction tool 8 is attached to X-axis table 6. Activating X-axis table 6 and Y-axis tables 5 horizontally displaces transferring head 7.

Beside carrier ways 2, ball supplying unit 9 for supplying conductive balls 40 is provided. Supplying unit 9 has arranging member 10 for arranging balls 40 into a predetermined arrangement pattern. Head 7 is placed above arranging member 10 and thereafter lowered toward arranging member 10. Thereby, head 7 sucks and picks up ball arranged on arranging member 10, using suction tool 8, and transfers balls 40 onto predetermined positions on substrate 30. As head 7, those picking up balls 40 using electrostatic, adhesive, and other force can be used as well as those vacuum-suck the balls with suction tool 8.

Figure 2:
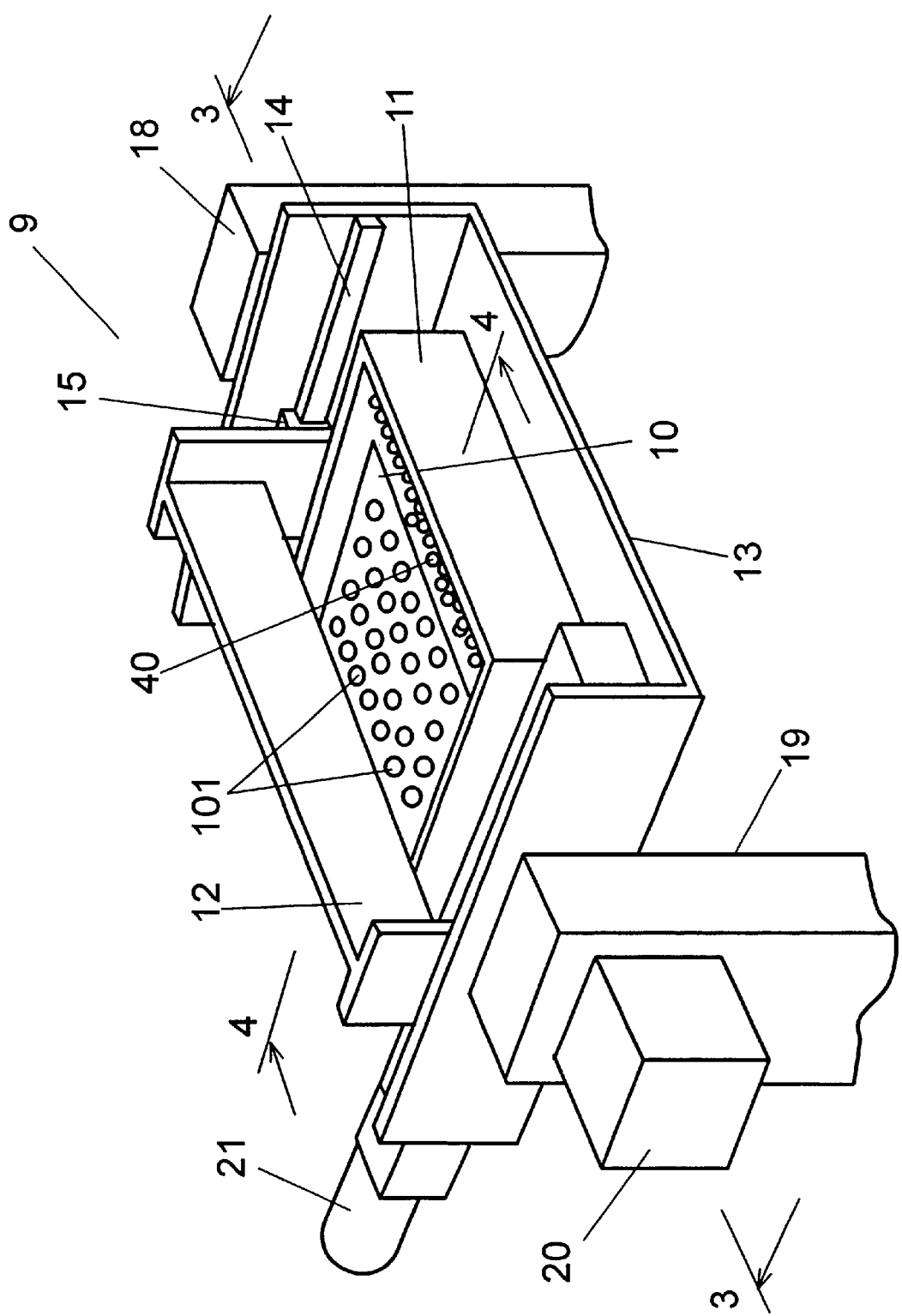
FIG. 2 is a perspective view of a ball supplying unit (supplying apparatus) of the above transferring apparatus.
Figure 3:
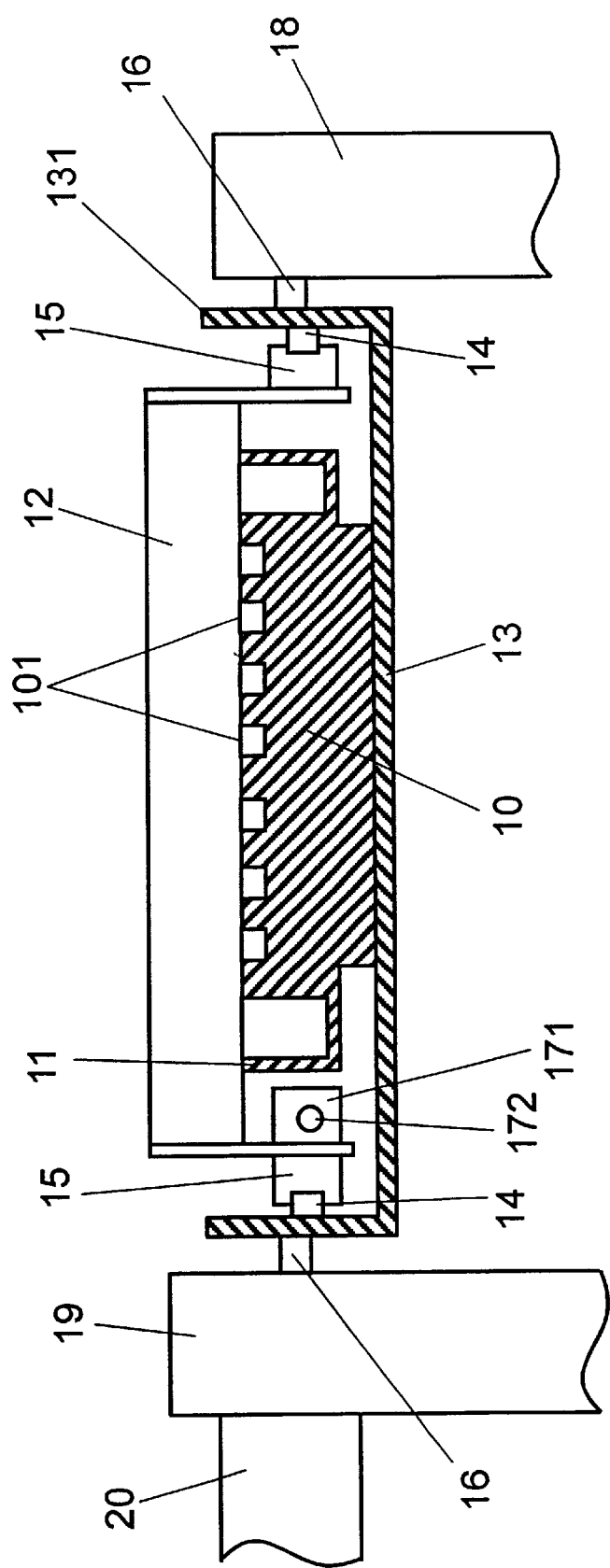

Next, referring to FIGS. 2, 3, and 4, ball supplying unit 9 (supplying apparatus) is described.

In FIG. 2, ball vessel 11 is substantially a box-like container for pooling conductive balls 40 therein. Inside of vessel 11, arranging member 10 having a trapezoidal cross section as shown in FIG. 4 is provided. Balls 40 are pooled in one of the spaces formed between the ramps of arranging member 10 and the side-walls of vessel 11.

In the top face of arranging member 10, a plurality of circular recesses 101 are provided in a grid pattern. The diameter and depth of recess 101 are set so that one recess can receive one ball 40 therein. The recesses 101 are arranged with a pitch equal to that of suction holes 81 (see FIG. 6) provided in suction tool 8 of transferring head 7.

FIG. 3 shows a sectional view taken on line 3—3 of FIG. 2. Vessel 11 is fixed to tilting base 13 having side-walls 131 on both sides thereof. On the inner face of side-walls 131, guide rails 14 are provided laterally. Connected to sliders 15 slidably fitted over the guide rails 14 is a member 12 for damming up balls. Damming-up member 12 is a board-like member erected perpendicularly to the top face of arranging member 10, and a slight clearance is kept between the bottom end of the damming-up member 12 and the top face of arranging member 10.

As shown in FIG. 3, nut 171 is connected to damming-up member 12. Feed screw 172 that is rotated by motor 21 shown in FIG. 2 is threaded through nut 171. Therefore, activating motor 21 translates damming-up member 12 along the top face of arranging member 10.

Connected to the exteriors of side-walls 131 are horizontal shafts 16, which are supported by bearings 18 and 19. One of shafts 16 passes through bearing 19 and connects to tilting mechanism 20. Tilting base 13 is pivoted about shafts 16 by activating tilting mechanism 20. By adjusting pivoting directions and angles of tilting mechanism 20, arranging member 10 fixed to tilting base 13 can be tilted in a predetermined direction by a predetermined angle with respect to a horizontal plane.

FIG. 4 shows a sectional view of vessel 11 taken on line 4—4 of FIG. 2. Ramp surfaces 102 are provided on both edges of arranging member 10, and recess 111 formed by the side-walls of vessel 11 and ramp surface 102 serves as a ball pooling section for pooling balls 40.

Next, referring to FIGS. 5A to 5C and 6A to 6C, the operation of the embodiment of the above structure is described.

Figure 5A:
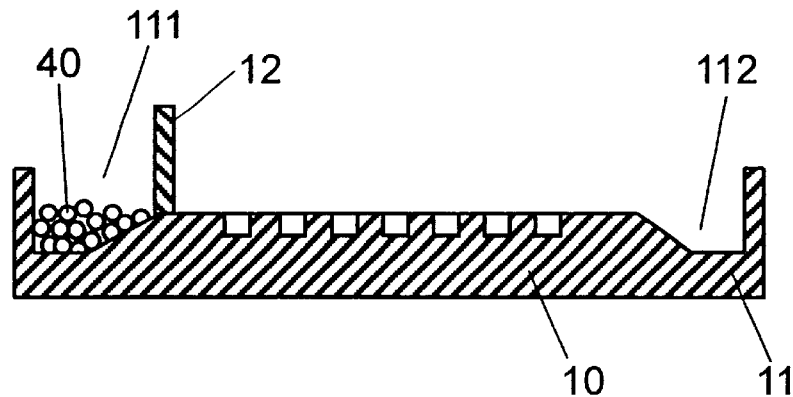
FIGS. 5A to 5C and 6A to 6C illustrate the operation of the above transferring apparatus.

First, prior to starting a transferring action, balls 40 are supplied to ball supplying unit 9. This supplying step is to pour balls 40 into a first recess 111 of vessel 11. FIG. 5A shows the condition after the balls have been supplied. Damming-up member 12 is kept ready for operation at the side of recess 111 in which balls 40 are pooled.

Thereafter, arranging member 10 is tilted by a predetermined angle with respect to the horizontal plane by activating tilting mechanism 20 shown in FIG. 3. At this moment, the tilting direction is set so that recess 111 in which the balls are pooled is on the upper side of the tilt. In other words, the tilting direction is set so that balls 40 are enabled to roll on arranging member 10 by the tilting action.

Figure 5B:
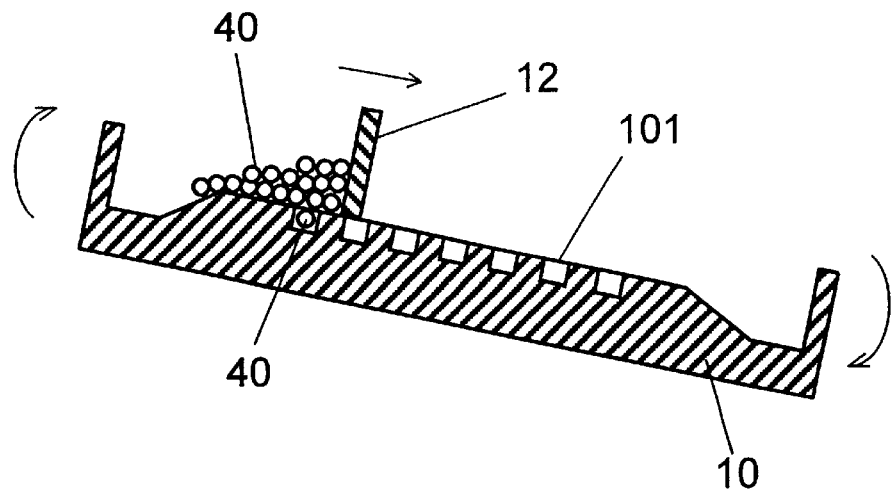

Subsequently, by activating motor 20 under the above condition, damming-up member 12 is translated along the top face of arranging member 10 in the direction the arranging member has been tilted, as shown in FIG. 5B. At this moment, the translating speed of damming-up member 12 is set to a predetermined value by controlling the number of revolutions of motor 21. Thereby, balls 40 pooled in recess 111 move at a predetermined speed as rolling along the top face of tilted arranging member 10 with the balls dammed up by damming-up member 12.

Then, balls 40 enter into recesses 101 formed in the top face of arranging member 10 during this moving process. Balls 40 are supplied into the respective recesses 101 provided to the whole extent of arranging member 10 by the translation of damming-up member 12 over the arranging member to its right edge.

Now, damming-up member 12, motor 21 for moving damming-up member 12, motor controller (not shown), feed screw 172, nut 171, and other components constitute a speed controller for controlling the moving speeds of balls 40 on arranging member 10.

Figure 5C:
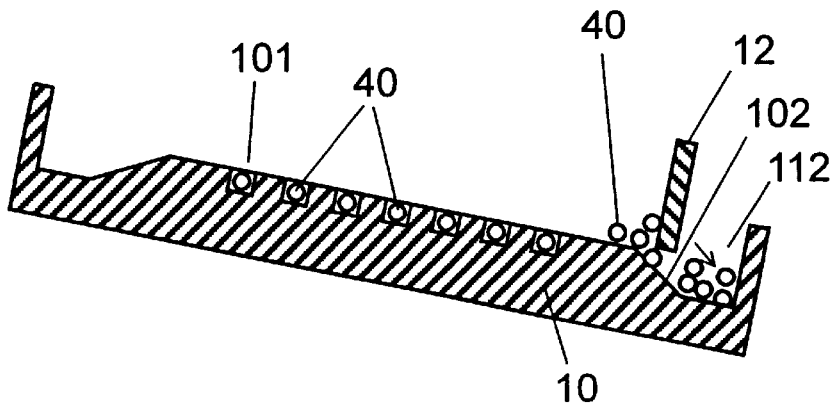

As shown in FIG. 5C, when damming-up member 12 is moved to a position above second recess 112 on the opposite side, balls 40 are moved through the clearance between the bottom face of damming-up member 12 and ramp face 102 to second recess 112.

When the arrangement of balls 40 into recesses 101 of arranging member 10 has been completed, the angle at which tilting base 13 is tilted is reset by activating tilting mechanism 20. This moves arranging member 10 into a horizontal position, in which the balls can be supplied to transferring head 7.

Figure 6A:
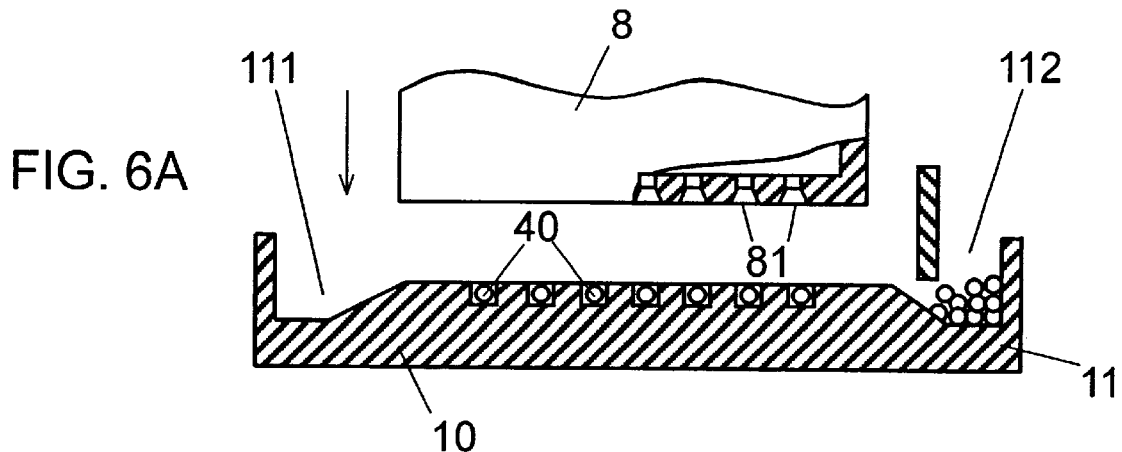

Next, head 7 is moved so that suction holes 81 of suction tool 8 are in register with recesses 101 of arranging member 10 as shown FIG.6A. Under such registered condition, suction tool 8 is lowered toward arranging member 10. Then, balls 40 are attached into suction holes 81 by the vacuum-suction through suction holes 81.

Figure 6B:
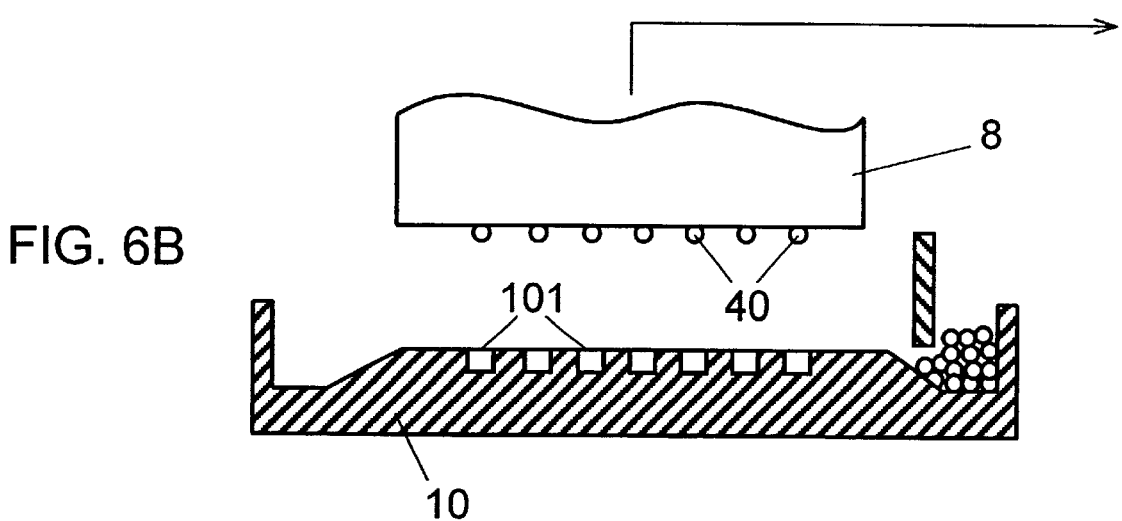

Subsequently, balls 40 are picked up, as shown in FIG. 6B, by suction tool 8 when head 7 is raised. Then, balls 40 are transferred onto substrate 30 by moving head 7 onto carrier ways 2 and causing its up-down movements there.

Figure 6C:
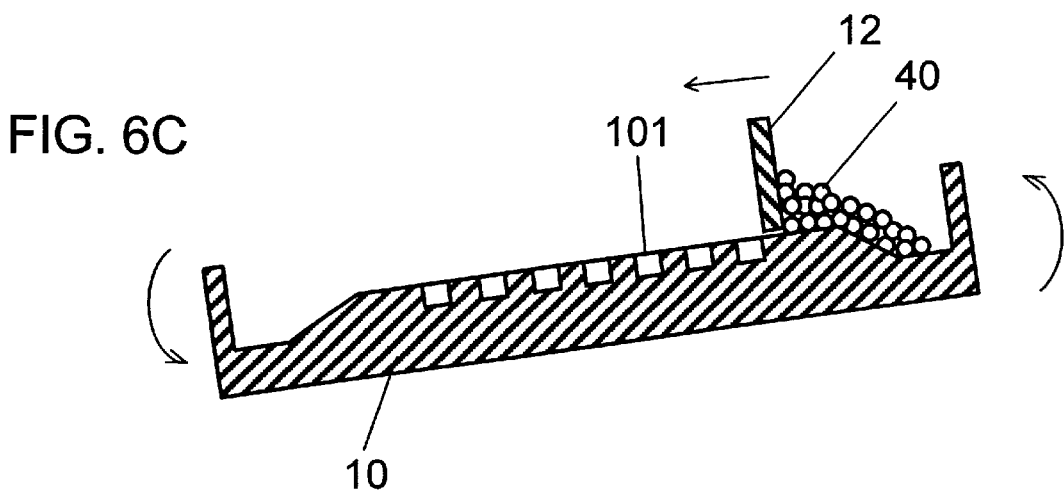

Thereafter, head 7 moves above ball supplying unit 9 to repeat similar pick-up actions. At this moment, balls 40 are collected in recess 112 on the opposite side of the recess used at the previous tilting action. Thus, as shown in FIG. 6C, the new tilting action for supplying balls is taken so as to tilt vessel 11 in the direction opposite to the previous one.

As hereinabove described, balls are supplied onto arranging member 10 by alternately tilting vessel 11 in opposite directions and reciprocating damming-up member 12 over arranging member 10.

In this way, when balls 40 are supplied into recesses 101 of arranging member 10, arranging member 10 is tilted, and balls 40 are moved on the top face of the tilted arranging member 10 with their moving speeds controlled by damming-up member 12. This allows balls 40 move at a predetermined speed in a stable manner. There are not any variations in the moving speed that may cause unstable behavior of the balls, and thereby balls 40 enter into recesses 101 in a stable manner. As a result, balls 40 can be arranged into recesses 101 within a short period of time, and damages to the balls can be prevented by appropriately controlling their moving speeds.

Figure 7:
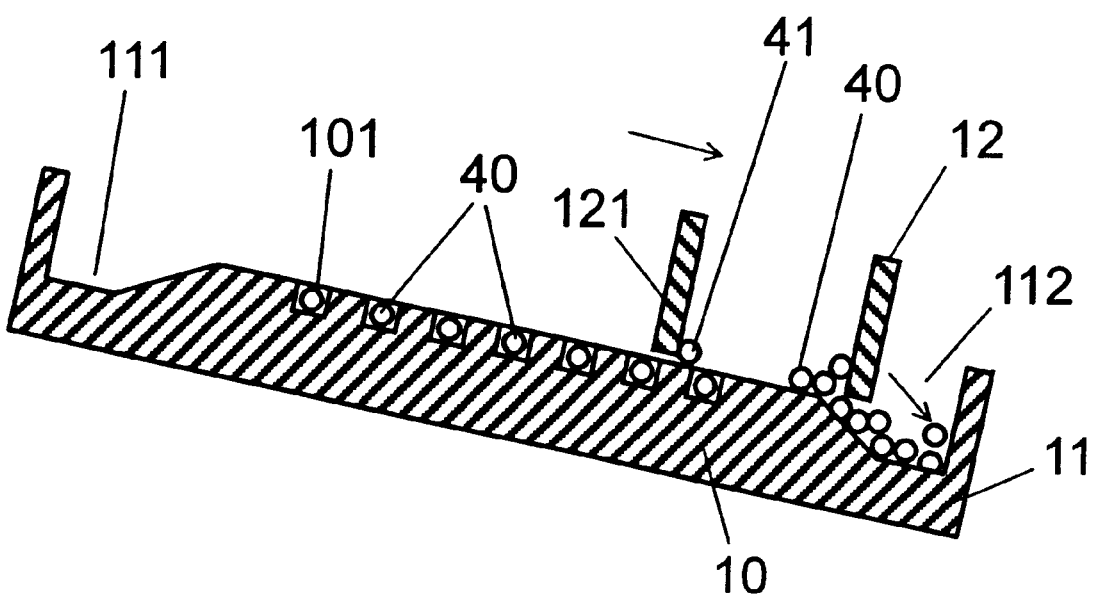
FIGS. 7, 8A, 8B, and 9 are partially sectional views of the ball supplying unit of the above transferring apparatus.

During this ball arranging action, extra balls may attach onto arranging member 10. As a countermeasure against this phenomenon, squeegee 121 that moves over arranging member 10 following damming-up member 12 as shown in FIG. 7 may be provided to scrape off extra balls 40 from the top face of arranging member 10.

Figure 8A:
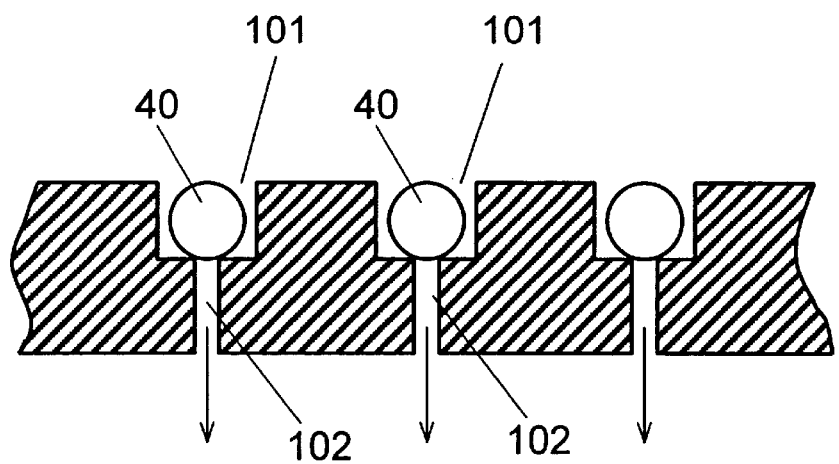

As another countermeasure, as shown in FIG. 8A, suction holes 102 may be provided in the bottoms of recesses 101 formed in arranging member 10 to vacuum-suck balls 40 through suction holes 102 when the balls are arranged. As a result, capturing force caused by suction force acts on balls 40, thus allowing the balls to be arranged more quickly.

Figure 8B:
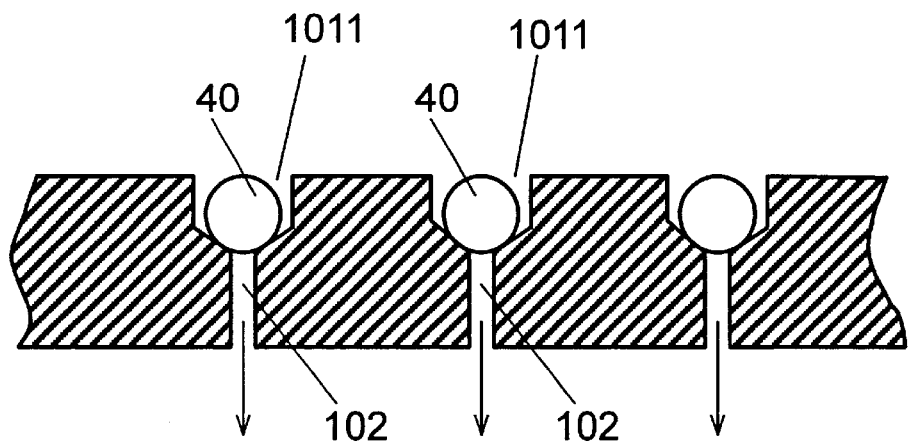

In addition, when the bottoms of recesses 1011 are tapered and the balls are vacuum-sucked through the tapered bottoms as shown in FIG. 8B, positioning stability of balls 40 is improved and the positions of the arranged balls can be maintained accurately. In order to arrange the balls 40 smoothly, vibration may be applied to tilted arranging member 10.

Figure 9:
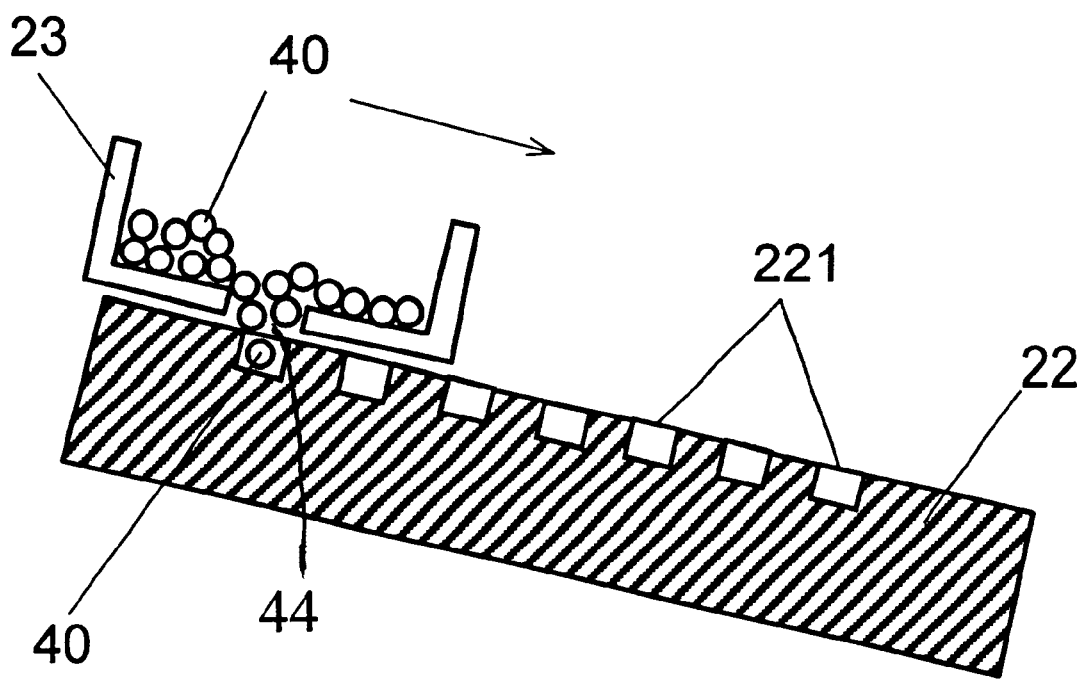

In this embodiment, shown is an example in which damming-up member 12 of a simple board-like member is used as a component of a speed controller that controls the moving speeds of balls 40 on arranging member 10; and members in other forms can be used. FIG. 9 shows an example of such forms.

In FIG. 9, recesses 221 similar to the above recesses 101 are formed in arranging member 22. Like the above arranging member 10, arranging member 22 can be tilted with respect to a horizontal plane. On the face of tilted arranging member 22, movably provided is ball supplying box 23, i.e. a container with a slit-like opening 44 in its bottom. Box 23 pools conductive balls 40 therein, and moves on the face of tilted arranging member 22 while controlled at a predetermined speed by moving means similar to the above damming-up member 12. In this case, the speed controller includes a container (box 23) moving at a predetermined speed.

As box 23 is moved on arranging member 22 with balls 40 pooled therein, balls 40 are supplied onto the top face of arranging member 22 through the slit 44 formed in the bottom of box 23 and enter into recesses 221. Thus, balls 40 are arranged onto arranging member 22. During the movement, since the moving speeds of balls 40 are controlled at a predetermined value, there are not any variations in the moving speeds that may cause unstable behavior of balls 40. Thus, the same effect as is obtained by the above damming-up member 12 can be obtained.

As hereinabove described, according to the present invention, while an arranging member having in its top face a plurality of recesses in a predetermined arrangement pattern each capable of receiving one conductive ball is tilted with respect to a horizontal plane, conductive balls are moved along the top face in a direction the arranging member has been tilted. During the movement, the moving speeds of the conductive balls are controlled by a speed controller, and thus the moving speeds of the conductive balls are kept stable and the balls can be arranged in the recesses quickly without fail.

What is claimed is:
1. A conductive ball transferring apparatus including:
   (a) an arranging member having in a top face thereof a plurality of recesses in a predetermined pattern each capable of receiving one said conductive ball therein, a first bin for receiving said conductive balls and a second bin for receiving said conductive balls, said first bin located adjacent a first end of said arranging member, said second bin located adjacent a second end of said arranging member;
   (b) a tilting mechanism for tilting said arranging member with respect to a horizontal plane, said tilting mechanism operative for tilting said arranging member in a first direction and a second direction which is opposite to said first direction; and
   (c) a speed controller for controlling the speed that said conductive balls traverse said top face of said tilted arranging member;
   wherein when said arranging member is tilted in said first direction said conductive balls contained in said first bin are displaced such that the conductive balls travel over said top face of said arranging member in the direction of said second bin, and when said arranging member is tilted in said second direction said conductive balls contained in said second bin are displaced such that the conductive balls travel over said top face of said arranging member in the direction of said first bin.

2. The conductive ball transferring apparatus according to claim 1, wherein when said conductive balls contained in said first bin are displaced by tilting the arranging member in said first direction, any of the conductive balls which are not disposed in the recesses formed in the top face of the arranging member are collected in said second bin.

3. The conductive ball transferring apparatus according to claim 1, wherein when said conductive balls contained in said second bin are displaced by tilting the arranging member in said second direction, any of the conductive balls which are not disposed in the recesses formed in the top face of the arranging member are collected in said first bin.

4. The conductive ball transferring apparatus according to claim 1, wherein said arranging member is a unitary member.

5. The conductive ball transferring apparatus according to claim 1, further comprising:
   (d) a transferring head for picking up said conductive balls arranged on said arranging member and transferring said balls to predetermined positions.

6. The conductive ball transferring apparatus according to claim 1, wherein said speed controller comprises a dam member that moves at a predetermined speed so as to retard the movement of said conductive balls on said top face of said arranging member.

7. The conductive ball transferring apparatus according to claim 6, wherein when said arranging member is tilted in said first direction, said dam member moves in the direction of said second bin and upon traversing the entire top face of said arranging member said position of said dam member is such that it allows the conductive balls to enter said second bin.

8. The conductive ball transferring apparatus according to claim 6, wherein when said arranging member is tilted in said second direction, said dam member moves in the direction of said first bin and upon traversing the entire top face of said arranging member said position of said dam member is such that it allows the conductive balls to enter said first bin.

9. The conductive ball transferring apparatus according to claim 6, further comprising:
(e) a squeegee member which traverses said top face of said arranging member subsequent to said dam member so as to remove said conductive balls remaining on said top face of said arranging member.

10. The conductive ball transferring apparatus according to claim 6, wherein said arranging member further includes suction holes formed at the bottom of said recesses so as to allow a suction force to be applied to said recesses.

11. The conductive ball transferring apparatus according to claim 10, wherein said recesses have a tapered configuration so as to more accurately position said conductive balls in said recesses.

12. A conductive ball transferring apparatus including:
(a) an arranging member having in a top face thereof a plurality of recesses in a predetermined pattern each capable of receiving one said conductive ball therein;
(b) a tilting mechanism for tilting said arranging member with respect to a horizontal plane, said tilting mechanism operative for tilting said arranging member in a first direction and a second direction which is opposite to said first direction; and
(c) a container for receiving a plurality of said conductive balls, said container having a lower surface having a slit opening formed therein, said container being disposed on said top face of said arranging member;
wherein when said arranging member is tilted in said first direction said container traverses said top face of said arranging member in a first direction, and when said arranging member is tilted in said second direction said container traverses said top face of said arranging member in a second direction opposite to the first direction, said conductive balls being deposited in said recesses via said slit opening when said container moves over said top face of said arranging member in said first direction and in said second direction.

13. The conductive ball transferring apparatus according to claim 12, further comprising:
(d) a transferring head for picking up said conductive balls arranged on said arranging member and transferring said balls to predetermined positions.

14. The conductive ball transferring apparatus according to claim 12, wherein said arranging member further includes suction holes formed at the bottom of said recesses so as to allow a suction force to be applied to said recesses.

15. The conductive ball transferring apparatus according to claim 14, wherein said recesses have a tapered configuration so as to more accurately position said conductive balls in said recesses.

16. A conductive ball transferring method comprising the steps of:
(a) providing a plurality of conductive balls in an arranging member, said arranging member having in a top face thereof a plurality of recesses in a predetermined pattern each capable of receiving one said conductive ball therein, a first bin for receiving said conductive balls and a second bin for receiving said conductive balls, said first bin located adjacent a first end of said arranging member, said second bin located adjacent a second end of said arranging member;
(b) tilting said arranging member in a first direction with respect to a horizontal plane such that said conductive balls contained in said first bin are displaced and traverse said top face of said arranging member in the direction of said second bin, said conductive balls being deposited in said recesses as said conductive balls traverse said top face of said arranging member, any of said conductive balls not disposed in said recesses are collected in said second bin;
(c) picking up said conductive balls disposed in said recesses in said arranging member and transferring said conductive balls to predetermined positions;
(d) tilting said arranging member in a second direction with respect to a horizontal plane such that said conductive balls contained in said second bin are displaced and traverse said top face of said arranging member in the direction of said first bin, said conductive balls being deposited in said recesses as said conductive balls traverse said top face of said arranging member, any of said conductive balls not disposed in said recesses are collected in said first bin; and
(e) picking up said conductive balls disposed in said recesses in said arranging member and transferring said conductive balls to predetermined positions.

17. The conductive ball transferring method according to claim 16, further comprising the step of:
controlling the speed at which the conductive balls traverse the top face of the arranging member by utilizing a dam member that moves at a predetermined speed across said top face of said arranging member.

18. The conductive ball transferring method according to claim 17, wherein when said arranging member is tilted in said first direction, said dam member moves in the direction of said second bin and upon traversing the entire top face of said arranging member said position of said dam member is such that it allows the conductive balls to enter said second bin.

19. The conductive ball transferring method according to claim 17, wherein when said arranging member is tilted in said second direction, said dam member moves in the direction of said first bin and upon traversing the entire top face of said arranging member said position of said dam member is such that it allows the conductive balls to enter said first bin.

20. The conductive ball transferring method according to claim 17, further comprising the step of removing said conductive balls remaining on said top face of said arranging member by moving a squeegee member over said top face of said arranging member subsequent to said dam member.

21. The conductive ball transferring method according to claim 16, further comprising the steps of:
forming suction holes at bottom of said recesses, and applying a suction force to said suction holes so as secure said conductive balls in said recesses.

22. The conductive ball transferring method according to claim 21, wherein said recesses have a tapered configuration so as to more accurately position said conductive balls in said recesses.

23. A conductive ball transferring method comprising the steps of:
(a) providing a plurality of conductive balls in a container, said container having a slit opening formed in a bottom surface thereof,
(b) positioning said container on a top face of an arranging member, said arranging member having in said top face thereof a plurality of recesses in a predetermined pattern each capable of receiving one said conductive ball therein,
(b) tilting said arranging member in a first direction with respect to a horizontal plane such that said container traverses said top face of said arranging member in a first direction, said conductive balls being deposited in said recesses via said slit opening formed in said bottom surface of said container as said container traverses said top face of said arranging member;

(c) picking up said conductive balls disposed in said recesses in said arranging member and transferring said conductive balls to predetermined positions;

(d) tilting said arranging member in a second direction with respect to the horizontal plane such that said container traverses said top face of said arranging member in a second direction opposite to said first direction, said conductive balls being deposited in said recesses via said slit opening formed in said bottom surface of said container as said container traverses said top face of said arranging member; and (e) picking up said conductive balls disposed in said recesses in said arranging member and transferring said conductive balls to predetermined positions.

24. The conductive ball transferring method of claim 23, further comprising the steps of:

forming suction holes at bottom of said recesses, and applying a suction force to said suction holes so as secure said conductive balls in said recesses.

25. The conductive ball transferring method of claim 24, wherein said recesses have a tapered configuration so as to more accurately position said conductive balls in said recesses.

* * * * *